United States Patent [19]

Heissenberger et al.

[11] Patent Number: 4,866,837
[45] Date of Patent: Sep. 19, 1989

[54] DUAL PORT ALIGNMENT ASSEMBLY STATION FOR ATTACHING COMPONENTS TO CIRCUIT BOARDS

[75] Inventors: Gail M. Heissenberger, El Cajon; Timothy E. Dearden, Hermosa Beach; David M. Zehnpfennig, Manhattan Beach, all of Calif.

[73] Assignee: Hughes Aircraft Company, Los Angeles, Calif.

[21] Appl. No.: 128,234

[22] Filed: Dec. 3, 1987

[51] Int. Cl.$^4$ .............................................. B23P 19/00
[52] U.S. Cl. ........................................ 29/741; 29/759; 29/833
[58] Field of Search ................. 29/833, 834, 741, 720, 29/759; 228/6.2

[56] References Cited

U.S. PATENT DOCUMENTS

| | | | |
|---|---|---|---|
| 4,222,036 | 9/1980 | Troukens | 29/720 |
| 4,404,741 | 9/1983 | Lebet et al. | 29/833 X |
| 4,628,464 | 12/1986 | McConnell | 29/759 X |
| 4,675,993 | 6/1987 | Harada | 29/759 X |
| 4,731,923 | 3/1988 | Yagi et al. | 29/833 |

FOREIGN PATENT DOCUMENTS 107202  6/1984  Japan ..................... 29/833

OTHER PUBLICATIONS

IBM Tech. Discl. Bull., vol. 27, No. 6, Nov. 1984, pp. 3653-3655, by Chester et al., (29/833).

Primary Examiner—Howard N. Goldberg
Assistant Examiner—Carl J. Arbes
Attorney, Agent, or Firm—William J. Streeter; Wanda K. Denson-Low

[57] ABSTRACT

An assembly station (10) is used to align termini or leads of components (16) with attachment pads on circuit boards (20) to enable the component and circuit board pads to be precisely aligned and coupled together. A dual port probe (22), which is secured to an x-y table, is provided with upper and lower viewing ports (30, 32) which respectively view the component and the circuit board. Images from the two are directed to video cameras (34, 36) and the signals therefrom are processed by a vision system (38) which compares the alignment of the pads and provides error correction signals (x, y, θ) to a robotic arm (12) to move component (16) and its pad or termini into alignment with the pads on the circuit board. Thereafter, the robotic arm brings the component into contact with the circuit board for soldering of the respective leads together.

18 Claims, 4 Drawing Sheets

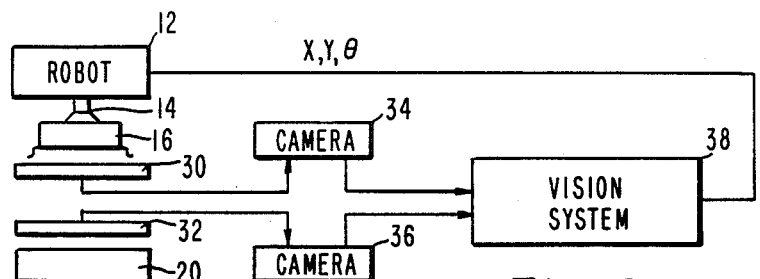
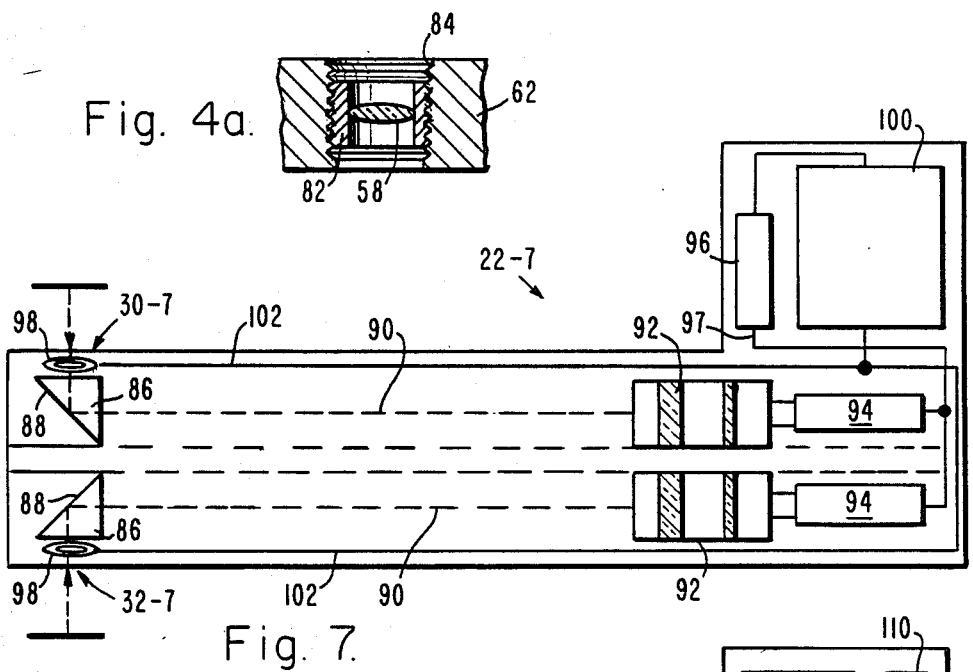
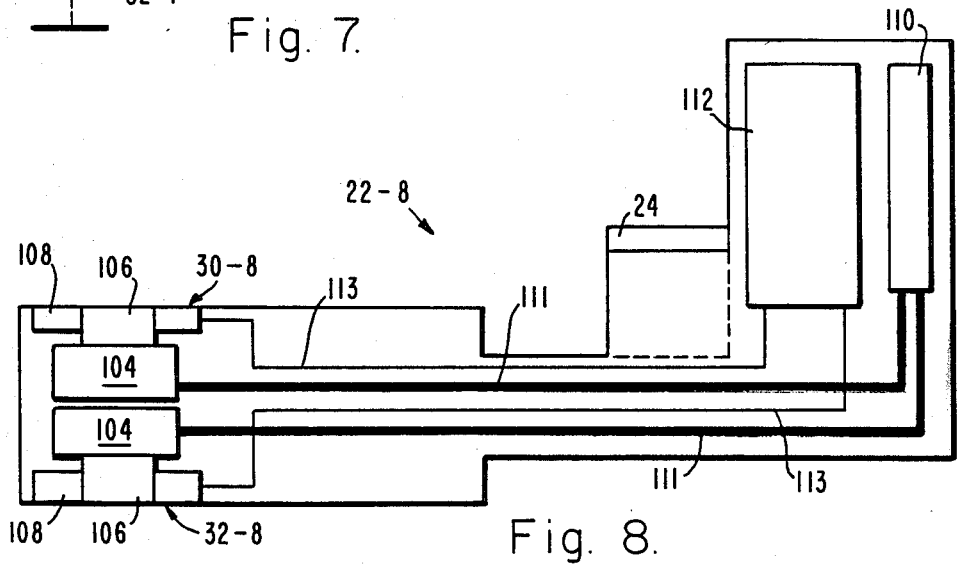

DUAL PORT ALIGNMENT ASSEMBLY STATION FOR ATTACHING COMPONENTS TO CIRCUIT BOARDS

BACKGROUND OF THE INVENTION

This invention was made with Government support under contract N00030-86-C 0083 awarded by the Department of the Navy. The Government has certain rights in this invention.

The present invention relates to a system and method for automatic placement of components on circuit boards and the like and, in particular, to such a system and method for aligning component termini with mating connection pads on such circuit boards.

The placement of components on and attachment to circuit boards and the like requires a registration of the respective mating pads of the component and circuit board. The conventional alignment technique is to mount cameras over the fields of view of interest which comprise both the component leads or pads and the placement pads so that both could be seen simultaneously. Any offsets between the two are noted, and a robot arm holding the component is instructed to orient the component so that its leads are aligned with the circuit board pads, and the two are then placed together and soldered or otherwise attached.

Conventionally, nine or more video cameras with lensing are used to create the overlapping field effect in order to see both sets of pads on the component and the circuit board.

Because of difficulties in developing software for producing a combined image, the alignment of the corresponding pads and, consequently, the placement of the two together is not necessarily accurate. Further, the use of conventional cameras and lensing creates a relatively bulky and costly piece of equipment, which is prone to vibration and consequent error and misalignment. In addition, the illumination required for lighting the component and circuit board pads creates shadowing of the pads and somewhat fuzzy images seen by the cameras, thereby complicating the processing of the images.

SUMMARY OF THE INVENTION

The present invention overcomes and avoids these and other problems by holding a component and its termini or pads and the circuit board and its termini or pads in positions preliminary to their attachment, obtaining information respectively of the positions of the component termini and of the positions of the attachment pads, comparing the respective information, and moving the component with respect to the circuit board both in translation and in rotation so as to obtain the necessary alignment between the component and circuit board termini or pads. Thereafter, the component is placed on the circuit board and the respective termini or pads are soldered or otherwise electrically and mechanically secured together.

Specifically, the component is held by an appropriate robotic mechanism over the circuit board, and a dual port placement probe is inserted between the component and the circuit board. The probe is provided with a pair of oppositely directed viewing arrangements which respectively look toward the component and the circuit board. The optical images from the termini or pads on both the component and the circuit board are then detected by respective cameras for the two, and the signals derived from the images obtained by the cameras are processed manually or, preferably, by a conventional vision system. The system produces signals to drive the robot holding the component. The particular system for viewing the component and the circuit board depends upon the accuracy and quality of imaging required, for example, in terms of unit of linear measurement per pixel accuracy.

Thus, the field of view observed may be viewed by a single sensing element, such as by an optical element, e.g., a mirror, a mirror-coating on the hypotenuse of a triangularly shaped lens, or a totally internally reflecting lens, or a charge coupled device sensor for full field of view sensing or a plurality of coherent optical fiber imaging conduits viewing a segmented field of view for greater accuracy of sensing.

Several advantages are derived from the above systems. Because the placement probe has both upper and lower port imaging capabilities, the components can be aligned with and placed on circuit board pads in a simple operation. Obtaining of images of the component and circuit board pads can be distanced from the image collecting cameras, for example, by relatively small lenses and sensors, so that the field of view for each component and circuit board can be reduced to less than a 0.2 square inch area to enable placement of even such relatively large components as a 68 leaded quadpack. Thus, bulky hardware fixtures otherwise required to hold large lenses and cameras in place are eliminated. Reduction in the size of illumination means adjacent the lenses or sensors is also possible. Accuracy in alignment is increased with simpler, less costly and less bulky equipment.

Other aims and advantages, as well as a more complete understanding of the present invention, will appear from the following explanation of exemplary embodiments and the accompanying drawings thereof.

DESCRIPTION OF THE DRAWINGS

FIG. 2 is a view in schematic form showing a complete system for sensing the alignment condition and for providing alignment between component and circuit board pads;

FIG. 4a is a detail of a lens focusing feature used with an optical fiber of FIG. 4;

FIG. 7 is a view similar to that of FIG. 3, but illustrating a second embodiment of the present invention; and FIG. 8 depicts a third embodiment of image obtaining devices positioned adjacent the field of view imaging plate.

DETAILED DESCRIPTION OF THE PREFERRED EMBODIMENTS

Figure 1:
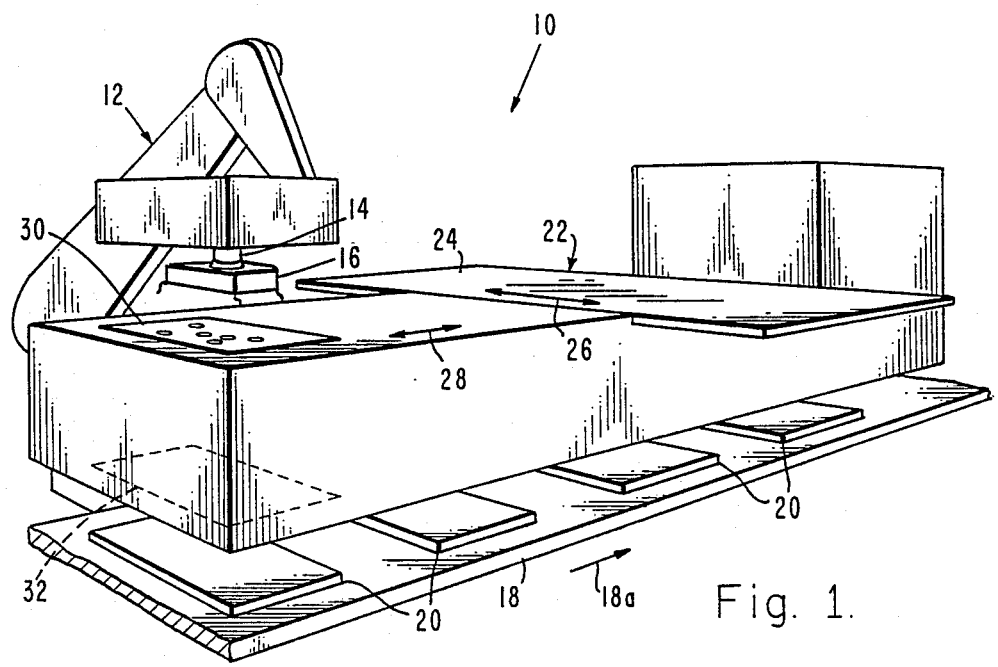
FIG. 1 is a perspective view of the present invention and associated equipment including a robotic arm for holding a component, a shuttle track on which circuit boards are conveyed and a probe for viewing the component and the circuit board.

Accordingly, as shown in FIG. 1, a component placing mechanism 10 includes a robotic arm 12 with a holder 14 for holding a component 16 in position above a shuttle track or conveyor belt 18. A plurality of circuit boards 20 or the like are held on belt 18. Positionable between component 16 and circuit boards 20 is a dual port probe 22.

Probe 22 includes a gantry attachment 24 which enables the probe to be secured to a conventional x-y table, to enable the probe to be moved two dimensionally in translation with respect to the component and the circuit board in the linear directions represented by normally positioned double headed arrow lines 26 and 28. Thus, probe 22 may be moved precisely with respect to component 16 and a selected circuit board 20 or, after its probing operation is completed, it can be moved completely away from its position between the component and the circuit board so that the two may be secured together.

Shuttle track 18 is disposed to move to discrete positions in the direction of arrow headed line 18a in order to position a particular one of circuit boards 20 in general alignment with its component 16 which, by means of the present invention, is to be precisely aligned and thereafter secured to the one circuit board.

Figure 3:
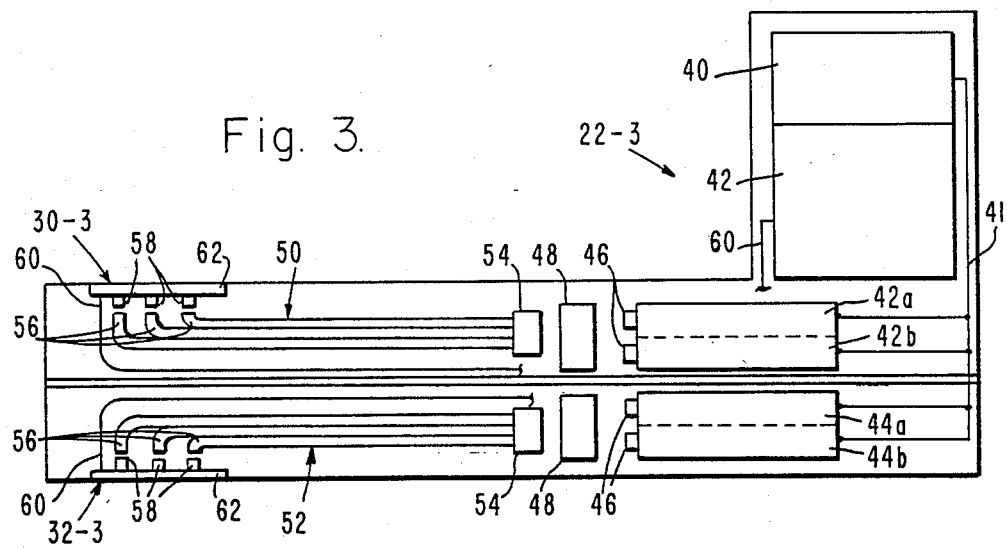
FIG. 3 is a view of the interior of a first embodiment of the probe depicted in FIG. 1.

As shown in FIGS. 1 and 2, and in greater detail in subsequent Figures, dual port probe 22 includes a pair of oppositely directed viewing ports 30 and 32. Comparable viewing ports for the embodiments depicted in FIGS. 3, 7 and 8 are denoted by indicia 30-3 and 32-3 for embodiment 22-3 of FIG. 3, indicia 30-7 and 32-7 for embodiment 22-7 of FIG. 7, and indicia 30-8 and 32-8 for embodiment 22-8 of FIG. 8. Viewing port 30, sometimes referred to as an upper viewing port, is designed to view component 16. Viewing port 32, sometimes referred to as a lower viewing port, is directed to view circuit board 20.

In all embodiments, e.g., see FIG. 2, the viewing ports are coupled to cameras 34 and 36 which receive images of the pads respectively on component 16 and on circuit board 20. Depending upon the desired resolution of pad image, camera 34 and camera 36 will comprise one or more cameras, defined in terms of the number of pixels a camera is able to handle and how the field of view is defined, e.g., as a field viewable as a whole or in segments. For the present invention, the greatest desired resolution is less than 2 mil per pixel. Because the components range in size from 300×400 mils to 1260×1260 mils for viewing by 384×492 pixel element cameras, a conventional type camera, two cameras per camera location 34 and two cameras per camera location 36 may be required, e.g., see FIGS. 3-6. It is to be understood, however, that a single camera having the necessary pixel elements, if available, can be used. The choice of camera may also depend upon the size of the camera, so as to enable it to be conveniently fitted within the housing of probe 22.

The images received by cameras 34 and 36 are forwarded to a vision system 38 of conventional design which compares the component and circuit board pad images as to their alignment or lack of alignment and forwards the necessary translational and rotational signals (denoted by x, y and $\theta$ in FIG. 2), to robotic arm 12 so that component 16 may be translated and/or rotated with respect to circuit board 20 and thus to bring its pads or termini into alignment with the corresponding pads or termini of circuit board 20.

When alignment has been achieved, probe 22 is then moved from its position between the component and the circuit board so that the robotic arm may then place the component on the circuit board with their pads in aligned contact. The component and circuit board pads are then soldered or otherwise electrically coupled, the component is released by the robotic arm, and shuttle track 18 moves one position to place a new circuit board in readiness for alignment and coupling to another component. If desired, after the robotic arm releases the component, but before further movement of the shuttle track, probe 22 may be again positioned over the component placed on the circuit board, to determine if the placement is successful.

Referring now to FIGS. 3-6, indicium 22-3 indicates the first embodiment of the present invention, for obtaining a maximum resolution, for example, of less than 2 mil per pixel accuracy in placement. Probe 22-3 includes viewing ports 30-3 and 32-3 at its component and circuit board viewing end and a camera power supply 40 and an illumination power supply 42 at its other end. Camera power supply 40 is coupled by leads 41 to a pair of cameras 42a and 42b for upper viewing port 30-3 and to a second pair of cameras 44a and 44b for lower viewing port 32-3. Viewing lenses 46 face toward a pair of focusing lenses 48 which receive light from coherent fiber optic imaging conduit bundles 50 and 52 respectively coupled to viewing ports 30-3 and 32-3. Specifically, each of the optical fiber bundles terminate in terminations 54, which arrange the ends of each of the fibers of bundles 50 and 52 in a pattern which cameras 42a, 42b and cameras 44a and 44b are capable of recognizing. The patterns at which bundles 50 and 52 terminate may not be, and generally are not, the same pattern as at their opposite termini at viewing ports 30-3 and 32-3. Terminations 56 are individually focused by individual focusing lenses 58.

Figure 4:
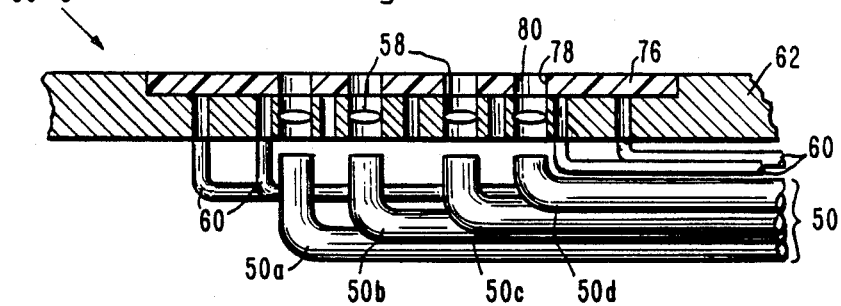
FIG. 4 is a cross sectional view, in greater detail, of the lensing or sensing end of the probe illustrated in FIG. 3.

A plurality of illuminating optical fibers 60, illustrated in FIGS. 3 and 4, are coupled to illumination power supply 42 for providing illuminating light at viewing ports 30-3 and 32-3. Windows 62 complete both viewing ports.

Figure 5:
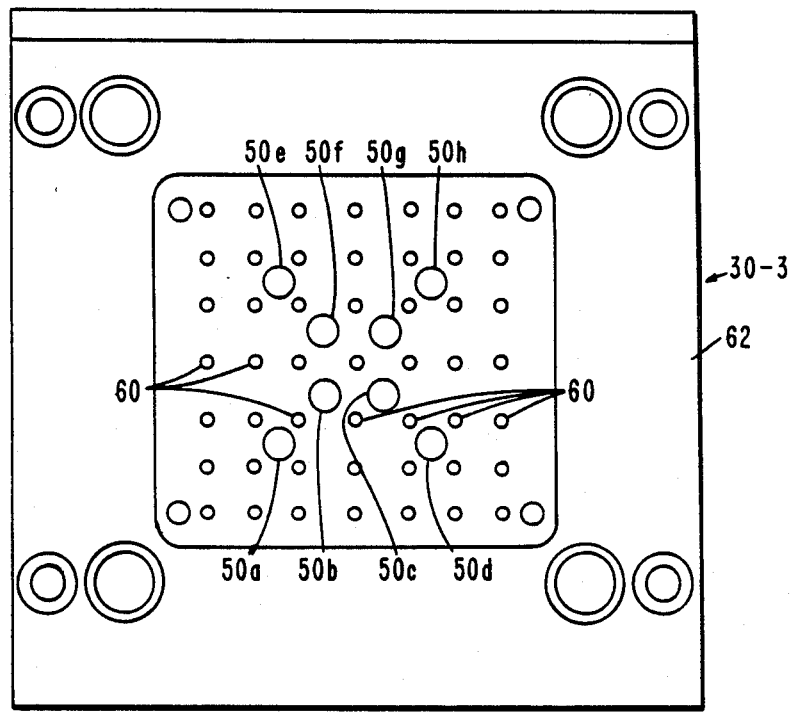
FIG. 5 is a top view of the viewing plate facing either of the component or the circuit board.
Figure 6A:
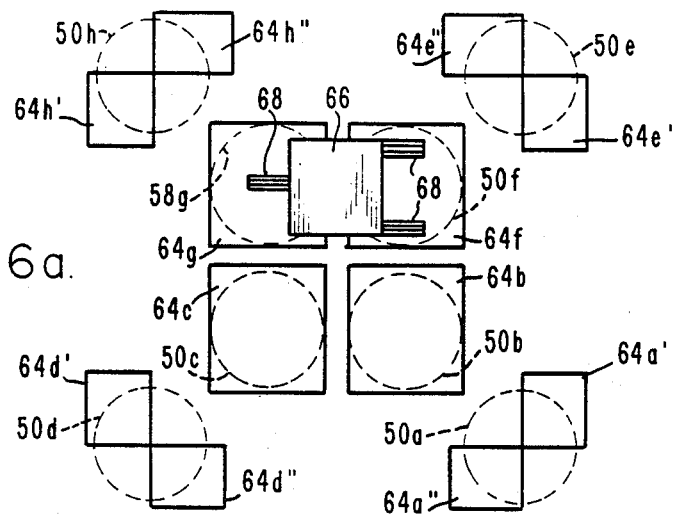
FIGS. 6a, 6b and 6c illustrate different types of patterns or layouts for dividing a field of view of the component and circuit board pads or termini, along with three different types of components which increase in size from a smallest in FIG. 6a to a largest in FIG. 6c.

FIGS. 4 and 5 illustrate viewing port 30-3; however, the same arrangement is as applicable to viewing port 32-3. Therefore, the remarks made with one apply to the other. For illustrative purposes of describing the present invention, bundle 50 comprises a plurality of coherent fiber imaging conduits 50a, 50b, 50c, 50d, 50e, 50f, 50g, and 50h. The number and positioning of fibers 50a, 50b, 50c, 50d, 50e, 50f, 50g and 50h depend upon the pattern or layout desired for the field of view. Such a field of view is illustrated in FIG. 6a, in which the positions of the optical fiber conduits are shown as dashed circles. The positions of conduits 50a, 50b, 50c, 50d, 50e, 50f, 50g and 50h in FIG. 6a are reversed from those shown in FIG. 5 because the views in FIGS. 5 and 6a look in opposite directions, downward and upward, respectively. As shown in FIG. 6a, the field of view is segmented or divided into eight windows of generally square configuration. According to this pattern, therefore, there are eight windows denoted generally as 64a, 64b, 64c, 64d, 64e, 64f, 64g and 64h, with windows 64b, 64c, 64f and 64g being full squares, as defining the center of the field of view, while outer corner windows comprise diagonally positioned smaller square corner segments comprising segments 64a' and 64a'', segments 64d' and 64d", 64e' and 64e" and segments 64h' and 64h". The four corner windows are further segmented, as diagonally opposed quarter squares, as an aid to identifying them as the outer corners of the field of view. It is to be understood that any other pattern or identification may be used so long as they provide a means for illuminating and identifying positions within the field of view. It is also to be understood that the segmentation of the field of view can include only portions of, rather than the entire field of view, so long as meaningful information is obtainable.

In FIG. 6a, only two windows are needed for a small component 66 having only a few leads 68. Thus, only windows 64f and 64g and optical fibers 50f and 50g are needed for performing the alignment process. Component 66 may comprise, for example, a leaded or leadless flat pack.

Figure 6B:
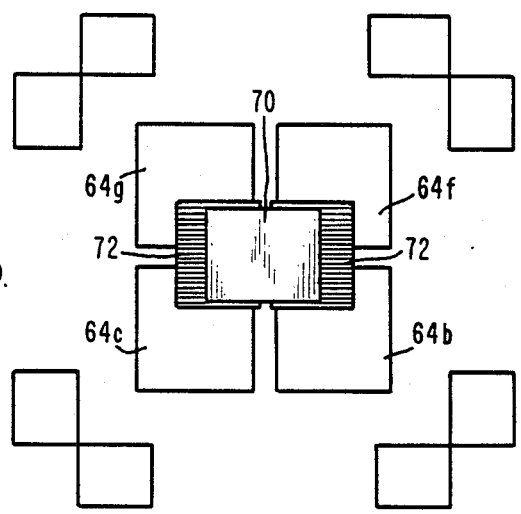

FIG. 6b illustrates a recognition of the leads for a different type or size of component 70 which may comprise two sets of lead 72 extending from opposite sides. For identification of these leads, it may be necessary to utilize four windows 64b, 64c, 64f and 64g. In this layout configuration, the far corner windows are not needed.

Figure 6C:
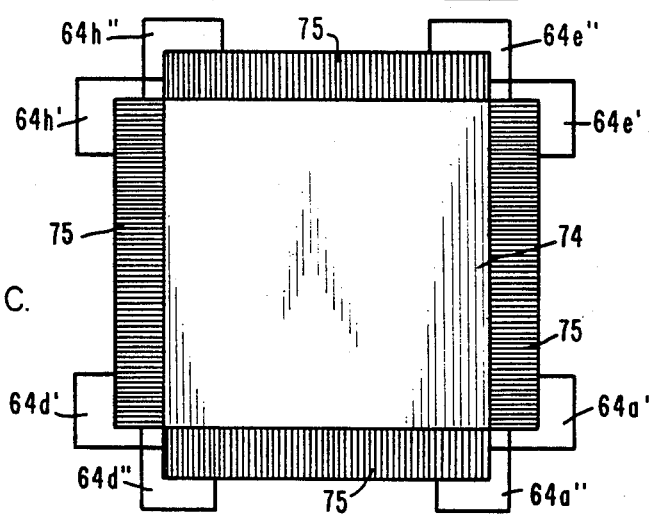

In FIG. 6c, all eight windows are used for an even larger component 74, which may comprise a 68 leaded quadpack.

Thus, a single pattern of eight windows and a corresponding number of optical fibers within bundle 50 are sufficient to define the layout or pattern of windows for a segmented field of view.

As shown in FIGS. 4 and 5, a plurality of illumination fibers 60 extend into face plate 62. The face plate is completed by a diffusion screen 76 which covers all of the outlets of illumination fibers 60, as an aide in preventing shadowing and in evenly distributing the illuminating light. However, to provide an unobstructed path for the light reflected from the component and circuit board, a plurality of openings 78 with clear lens covers 80 are placed above lens 58.

Focusing of the images of the pads onto the ends of optical fiber conduits 50a, 50b, 50c, 50d, 50e, 50f, 50g and 50h are effected by an adjustment system illustrated in FIG. 4a. As shown, lens 58 is securely held within a lens focusing cylindrical screw 82 which has a threaded engagement with a threaded sleeve 84 formed within face plate 62. By threading screw 82 within sleeve 84, lens 58 is moved towards or away from the end of its associated optical fiber to accomplish the necessary focusing.

The second embodiment depicted in FIG. 7, comprising dual port probe 22-7, may be used in place of that depicted in FIGS. 3-6 where the resolution and, therefore, a lesser expense is desired, for example, for small volume component placement on circuit boards. Both viewing ports 30-7 and 32-7 replace the optical fiber conduits and their lens of 10 FIGS. 3-6 with simple triangular prisms 86 whose hypotenuses 88 are silvered to enable the image to be reflected along their respective optical paths 90 to focusing lenses 92 and cameras 94. As before, the cameras are of conventional video camera design and are powered by a camera power supply 96 through leads 97. Light to illuminate the component and circuit board is provided by ring lights 98 which may comprise circularly shaped fluorescent lights. Ring lights 98 are powered by an illumination power supply 100 through wiring 102.

The third embodiment, comprising dual port probe 22-8, is shown in FIG. 8. This probe includes sensors 104 combined with camera lenses 106 with ring lights 108, similar to those fluorescent lamps 98 of FIG. 7, and provide illumination through a diffusion plate. A power supply 110 is coupled through leads 111 to sensors 104 while an illumination power supply 112 provides power through leads 113 for ring lights 108. This embodiment, like that of FIG. 7, provides for 1.5 inch fields of view. Sensors 104 may comprise charge coupled device sensors. Both camera sensors of FIGS. 7 and 8 contain 510×492 pixel elements with a resolution of 1 and 1.4 mils per pixel.

Although the invention has been described with respect to particular embodiments thereof, it should be realized that various changes and modifications may be made therein without departing from the spirit and scope of the invention.

What is claimed is:

1. Apparatus for aligning termini of components with attachment pads on circuit boards to enable coupling together of the termini and the pads, comprising:
   a holder for holding one of the components;
   a shuttle track for supporting the circuit boards and for moving one of the circuit boards with respect to the one component to position the pads thereof and the termini in general alignment with respect to one another;
   viewers respectively for individually viewing each of the termini and the pads and for obtaining position information thereof; and
   a system for processing the position information and for comparing the alignment of the termini and the pads and for orienting the termini with exact alignment to the pads.

2. Apparatus according to claim 1 in which said system includes robot means for moving the one component and its termini orthogonally and angularly in a plane parallel to that of the pads.

3. Apparatus according to claim 1 in which said viewers include two bundles of an equal number of coherent optical fiber imaging conduits having first ends respectively positioned to view the termini and the pads and second ends optically coupled to said system.

4. Apparatus according to claim 3 wherein said system includes a pair of video cameras, at which said optical fiber conduit second ends respectively terminate.

5. Apparatus for aligning termini of components with attachment pads on circuit boards to enable coupling together of the termini and the pads, comprising:
   a holder for holding one of the components;
   a shuttle track for supporting the circuit boards and for moving one of the circuit boards with respect to the one component to position the pads and the termini in general alignment with respect to one another;
   viewers respectively for individually viewing the termini and the pads and for obtaining position information thereof, and including two bundles of an equal number of coherent optical fiber imaging conduits having first ends respectively positioned to view the termini and the pads and second ends;
   a system including a pair of video cameras, at which said optical fiber conduit second ends respectively terminate, for processing the position information and for comparing the alignment of the termini and the pads and for orienting the termini with exact alignment to the pads; and means defining a field of view including a plurality of windows which are equal in number to the number of said optical fiber conduits in each said bundle and which are arranged to view corresponding portions of the termini and the pads which are to be coupled together, for transmission through said optical fiber conduit bundles and said second ends thereof respectively to said cameras.

6. Apparatus according to claim 5 in which the equal number of the windows and of said optical fiber conduits increase in number as the number of the termini and the pads increase.

7. Apparatus according to claim 6 in which the windows are arranged in a pattern according to the arrangement of the termini and the pads.

8. Apparatus according to claim 7 in which said system includes robot means for moving the one component and its termini orthogonally and angularly in a plane parallel to that of the pads.

9. Apparatus according to claim 5 in which said field of view means includes a face plate having openings therein numbered and arranged in accordance with those of the windows, and further including lenses respectively in said openings and movable with respect to said optical fiber first ends, for focusing of the respective termini and pads, and means for illuminating the respective termini and pads.

10. Apparatus according to claim 1 in which said viewers each includes an optical element for respectively transmitting a collective image of the termini and a collective image of the pads to respective ones of said cameras.

11. Apparatus according to claim 10 in which each said optical element comprises a right prism having a silvered hypotenuse.

12. Apparatus according to claim 10 in which each said optical element comprises a mirror.

13. Apparatus according to claim 10 in which each said optical element comprises a totally internally reflecting prism.

14. Apparatus according to claim 10 further including means for illuminating the termini and the pads.

15. Apparatus according to claim 10 in which each said optical element comprises an electro-optical sensor for direct viewing of the termini and the pads.

16. Apparatus according to claim 15 in which said system includes robot means for moving the one component and its termini orthogonally and angularly in a plane parallel to that of the pads.

17. Apparatus for aligning termini of components with attachment pads on circuit boards to enable coupling together of the termini and the pads, comprising:
a holder for holding one of the components;
means for supporting the circuit boards and for moving one of the circuit boards with respect to the one component to position the pads thereof and the termini in general alignment with respect to one another;
viewers respectively for individually viewing the termini and the pads and for obtaining position information thereof;
a system for processing the position information and for comparing the alignment of the termini and the pads and for orienting the termini with exact alignment to the pads; and
means defining a field of view including a plurality of windows which are equal in number to the number of said viewers and which are arranged to view corresponding portions of the termini and the pads which are to be coupled together, for transmission respectively to said viewers.

18. Apparatus according to claim 17 wherein said viewers includes a pair of video cameras coupled to said field of view means for receiving the transmission.

* * * * *